United States Patent
Kang et al.

(10) Patent No.: US 6,330,042 B1
(45) Date of Patent: *Dec. 11, 2001

(54) LIQUID CRYSTAL DISPLAY AND THE METHOD OF MANUFACTURING THE SAME

(75) Inventors: Sung-Ku Kang; Jung-Chul Huh, both of Kyungsangbook-do (KR)

(73) Assignee: LG. Philips LCD Co., Ltd., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/145,752

(22) Filed: Sep. 2, 1998

(30) Foreign Application Priority Data

Sep. 3, 1997 (KR) .................................................. 97-45678

(51) Int. Cl.[7] .............................. G02F 1/136; H01L 29/04
(52) U.S. Cl. .................................. 349/43; 349/42; 257/59
(58) Field of Search .............................. 349/42, 43, 187; 257/59, 72

(56) References Cited

U.S. PATENT DOCUMENTS

| | | | |
|---|---|---|---|
| 5,585,951 | * 12/1996 | Noda et al. | 349/42 |
| 5,818,550 | * 10/1998 | Kadota et al. | 349/43 |
| 5,949,507 | * 9/1999 | Shimada et al. | 349/43 |
| 5,969,778 | * 10/1999 | Oh et al. | 349/43 |
| 6,088,072 | * 7/2000 | Lee | 349/39 |
| 6,091,466 | * 7/2000 | Kim et al. | 349/38 |

* cited by examiner

Primary Examiner—William L. Sikes
Assistant Examiner—Tarifur R. Chowdhury
(74) Attorney, Agent, or Firm—Long Aldridge & Norman, LLP

(57) ABSTRACT

A method of manufacturing a liquid crystal display includes the steps of forming a gate electrode including a first metal on a substrate. A gate insulation layer is formed on the substrate having the gate electrode and a semiconductor layer is formed on the gate insulation layer covering the gate electrode. A source electrode contacting one side of the semiconductor layer, a drain electrode contacting the other side of the semiconductor layer using a second metal are formed. A passivation layer is formed on the substrate having the source electrode. A drain contact hole is formed by patterning some portion of the passivation layer and the drain electrode. The drain electrode has an etched side wall. A pixel electrode is formed contacting the etched side wall of the drain electrode using a conductive material.

29 Claims, 8 Drawing Sheets

LIQUID CRYSTAL DISPLAY AND THE METHOD OF MANUFACTURING THE SAME

This application claims the benefit of Korean Patent Application No. 97-45678, filed on Sep. 3, 1997, which is hereby incorporated by reference.

BACKGROUND OF THE INVENTION

1. Field of the Invention

The present invention relates to a method of manufacturing a liquid crystal display (LCD), which comprises an active panel including thin film transistors (TFTs) and pixel electrodes, i.e., to an active matrix liquid crystal display (AMLCD), and to the structure of a liquid crystal display made by the same method. Particularly, the present invention relates to a method of enhancing the electrical contact between the conductive materials for an enhanced screen quality and the structure of an LCD made by the same method.

2. Description of the Related Art

Among display devices for showing visual images on a screen, cathode ray tube (CRT) display devices, which have been used in general, are nowadays being replaced by thin film type flat panel displays which are thin, light and easily usable at any place. In particular, active research activities have been focusing on the development of liquid crystal displays because of their high resolution and fast response time suitable for display of motion picture images.

A liquid crystal display works by using polarization and optical anisotropy of a liquid crystal. The orientation of liquid crystal molecules is controlled by applying an electromagnetic field to the molecules which are arrayed in one direction and have polarization because of their long and thin shape. When controlling the orientation of liquid crystal molecules, transmission of a light through the liquid crystal is achieved due to the anisotropy of the liquid crystal. This principle is applied to a display device. Because active matrix liquid crystal displays (AMLCDs), which have TFTs arranged in a matrix pattern and pixel electrodes connected to the TFTs, provide high quality images and natural colors, they are actively studied. The structure of a conventional liquid crystal display will now be described.

The conventional liquid crystal display comprises two panels, on which various elements are placed, and liquid crystal between the two panels. One panel of the LCD includes elements reproducing colors, which is called a color filter panel. The color filter panel has color filters of red (R), green (G) and blue (B) which are sequentially arranged and correspond to pixels formed in a matrix pattern on a transparent substrate. Among these color filters, very thin black matrixes are formed in a lattice pattern. They prevent the mixture of colors at boundaries of the color filters. A common electrode covers the color filters, which functions as one electrode generating an electric field applied to the liquid crystal.

The other panel includes switching elements and bus lines which generate the electric field for driving the liquid crystal. It is called an active panel. The active panel has pixel electrodes which are formed on the transparent substrate. The pixel electrodes are opposite to the common electrode formed on the color filter panel, and functions as the other electrode generating the electric field applied to the liquid crystal. Signal bus lines run along the column direction of the array of the pixel electrodes, and data bus lines run along the row direction of the array of the pixel electrodes. At a corner of the pixel electrode, a TFT, which applies electromagnetic field to the pixel electrode, is formed. A gate electrode of the TFT is connected to the signal bus line (gate bus line), and a source electrode is connected to the data bus line (source bus line). A drain electrode of the TFT is connected to the pixel electrode. A gate pad and a source pad, which function as terminals receiving external signals, are formed at the end portions of the gate bus line and the source bus line, respectively.

When an external electric signal, which is applied to the gate pad, is sent to the gate electrode through the gate bus line, an electrical picture data, which is applied to the source pad, is sent to the source electrode through the source bus line and to the drain electrode. In the case that the electric signal is not applied to the gate electrode, the electrical picture data, which is applied to the source electrode over the gate electrode, is not sent to the drain electrode. Accordingly, whether the data signal is applied to the drain electrode is determined by controlling the signal to the gate electrode. Therefore, applying the data signal to the pixel electrode, which is connected to the drain electrode, is artificially controlled. In other words, the TFT functions as a switch for driving the pixel electrode.

These two panels are joined with a certain distance (called "cell gap"), and the liquid crystal is injected there-between. Finally, polarizing plates are attached to the outer surfaces of the two panels, and the liquid crystal panel of the LCD is completed.

There are various manufacturing methods and structures of the liquid crystal displays. Active research has been carried out in order to improve the efficiency of the LCD and to reduce the manufacturing costs. Conventional manufacturing method and structure of the LCD, which are related to the present invention, will now be described with reference to FIG. 1, which is a plan view showing the conventional LCD, and FIG. 2, which is a cross-sectional view showing a conventional manufacturing process taken along line II—II of FIG. 1.

A metal including aluminum or aluminum alloy is deposited on a transparent glass substrate 1. A gate electrode 11, a gate bus line 13 and a gate pad 15 are formed by patterning the metal. The gate electrode 11 is disposed at the corner of each pixel. The gate line 13 connects the gate electrodes 11 arrayed in the row direction. The gate pad 15 is formed at the end of the gate line 13 (FIG. 2a).

An inorganic insulating material such as silicon oxide ($SiO_x$) or silicon nitride ($SiN_x$) is deposited on the gate electrode 11, the gate line 13, and the gate pad 15 to form a gate insulating layer 17. Then, an intrinsic semiconductor material such as an intrinsic amorphous silicon and, a doped semiconductor material such as a doped amorphous silicon are sequentially deposited on the entire surface of the substrate. These two materials are patterned to form a semiconductor layer 33 and a doped semiconductor layer 35 at the portion at which the gate electrode 11 is formed (FIG. 2b).

A metal including chromium or chromium alloy is deposited and patterned to form a source electrode 21 which contacts one side of the semiconductor layer 33 with the doped semiconductor layer 35 between them. A drain electrode 31 contacts the other side of the semiconductor layer 33 with the doped semiconductor layer 35 between them. The source electrode 21 and drain electrode 31 form ohmic contacts with the doped semiconductor layer 35. Here, when the doped semiconductor layer 35 is between the source electrode 21 and the drain electrode 31 then, the source and drain electrodes are always electrically connected so the TFT cannot act as a switch. Therefore, the doped semiconductor layer 35 between the source 21 and the drain electrode 31 must be removed by continued etching after forming the source and drain electrode. The source electrodes 21 in a row direction are connected to the source bus line 23. The source pad 25 is placed at the end portion of the source bus line 23 (FIG. 2c).

An inorganic insulating material such as silicon oxide or silicon nitride is deposited on the whole surface of the substrate 1 to form a passivation layer 37. The passivation layer 37 is patterned to form a gate contact hole 53, a source contact hole 63, and a drain contact hole 73 which expose some portions of the gate pad 15, the source pad 25, and the drain electrode 31, respectively (FIG. 2d).

An Indium Tin Oxide(ITO) is deposited on the whole surface of the substrate 1 having the passivation layer 37. A pixel electrode 41, a gate pad connector 57, and a source pad connector 67 are formed by patterning the ITO. The pixel electrode 41 is connected to the drain electrode 31 through the drain contact hole 73. The gate pad connector 57 is connected to the gate pad 15 through the gate contact hole 53. The source pad connector 67 is connected to the source pad 25 through the source contact hole 63 (FIG. 2e).

According to the conventional method for manufacturing the LCD panel, the surface of the drain electrode 31 contacts the pixel electrode 41 through the drain contact hole 73 as shown in FIG. 3a. If the etching of the passivation layer 37 for forming the drain contact hole 73 is not sufficient, then a contaminating material 81 such as a residual material of the passivation layer 37 remains on the surface of the drain electrode 31. In this case, the electrical contact between the pixel electrode 41 and the drain electrode 31 becomes unstable. Moreover, because the source contact hole 63 is formed by the same method in the same etching step for forming the drain contact hole 73, the contaminating material 81 may also remain on the surface of the exposed source pad 25, as shown in FIG. 3b. Therefore, the electrical contact between the source pad 25 and the source pad connector 67 may not be stable as well. In particular, the contact resistance becomes higher than normal resulting from the contaminating material 81, so that the screen quality is defective from the distorted voltage signal of the image data.

SUMMARY OF THE INVENTION

Accordingly, the present invention is directed to a liquid crystal display and the method of manufacturing the same that substantially obviates one or more of the problems due to limitations and disadvantages of the related art.

An object of the present invention is to prevent the formation of a contaminating material at the contact portion of the drain electrode and source pad with the pixel electrode and source pad connector, respectively.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a step of forming a first metal layer and a passivation layer covering the first metal layer, a step of etching some portion of the passivation layer to form a contact hole exposing some portion of the first metal layer, a step of forming an etched side wall by etching the exposed portion metal layer through the contact hole, and a step of depositing a second metal layer electrically contacting the etched side wall of the first metal layer. The contact hole of the present invention is formed by etching the passivation layer and the first metal layer in a single step to have the substantially same shape. The etched side wall of the first metal layer is exposed through the contact hole. Then the etched side wall of the first metal layer contacts the second metal layer by depositing the second metal layer.

In another aspect of the present invention, a method of manufacturing a liquid crystal display comprises the steps of forming a gate electrode including a first metal on a substrate; forming a gate insulation layer on the substrate having the gate electrode; forming a semiconductor layer on the gate insulation layer covering the gate electrode; forming a source electrode contacting one side of the semiconductor layer, a drain electrode contacting the other side of the semiconductor layer using a second metal; forming a passivation layer on the substrate having the source electrode; forming a drain contact hole by patterning some portion of the passivation layer and the drain electrode, wherein the drain electrode has an etched side wall; and forming a pixel electrode contacting the etched side wall of the drain electrode using a conductive material.

In another aspect of the present invention, a liquid crystal display comprises a substrate; a gate electrode including a first metal on the substrate; a gate insulation layer over the gate electrode; a semiconductor layer including an intrinsic semiconductive material on the gate insulation layer; a source electrode including a second metal on a first side of the semiconductor layer; a drain electrode including the second metal on a second side of the semiconductor layer; a passivation layer covering the source and drain electrodes and including a drain contact hole exposing a side wall of the drain electrode; a pixel electrode including a conductive material and contacting the side wall of the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the inventing and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
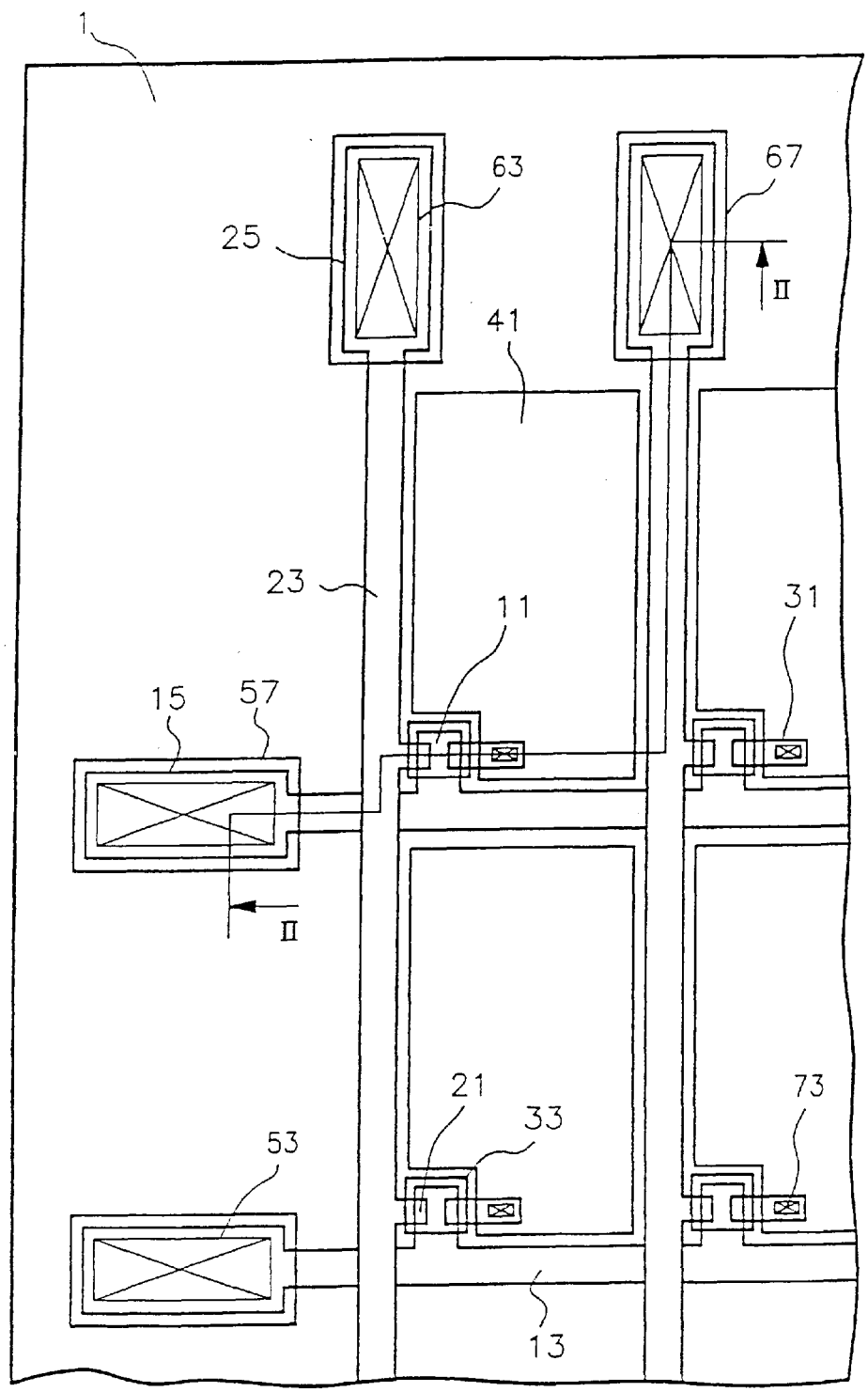
FIG. 1 is an enlarged plan view showing a conventional liquid crystal display.
Figure 2A:
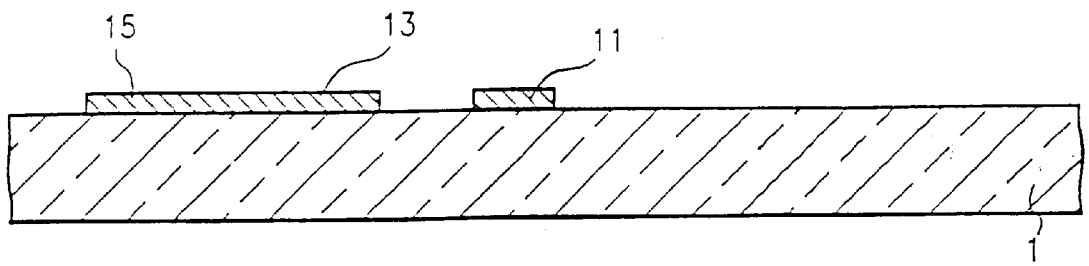
FIGS. 2a–2e are cross-sectional views showing a manufacturing process of the conventional liquid crystal display.
Figure 2B:
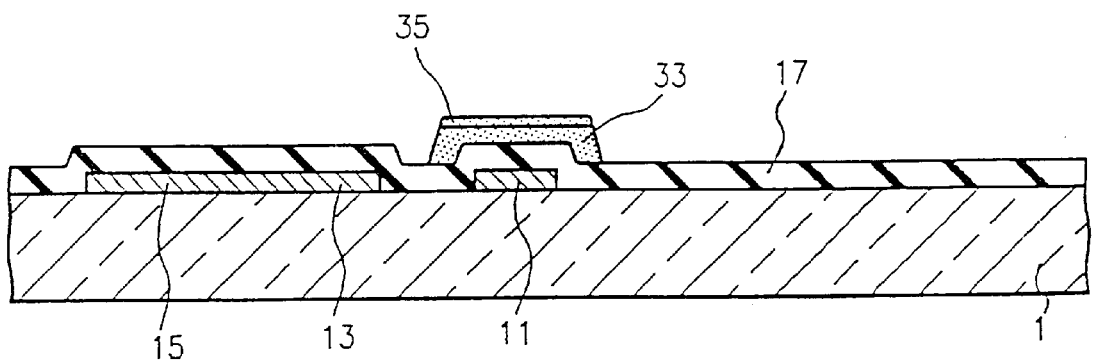
Figure 2C:
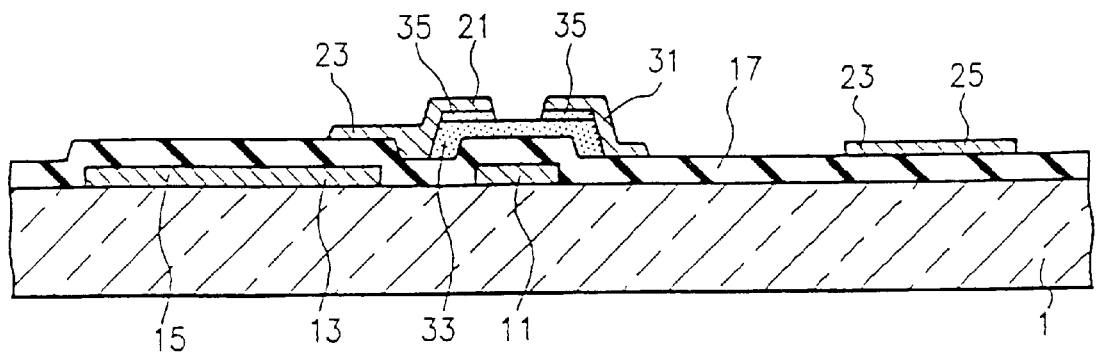
Figure 2D:
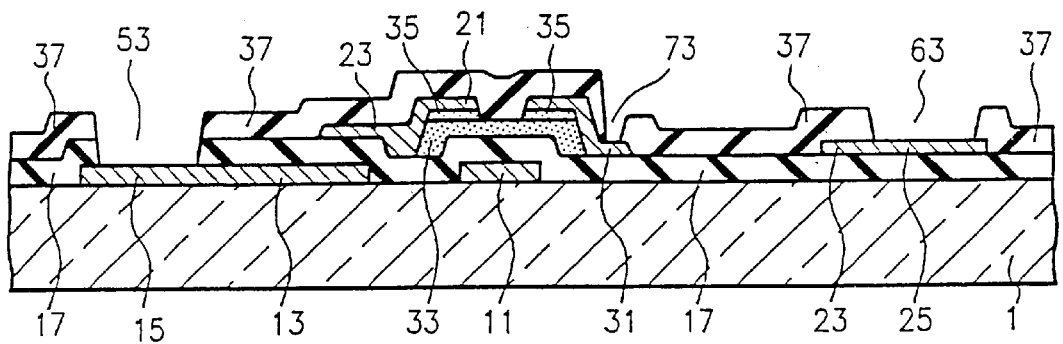
Figure 2E:
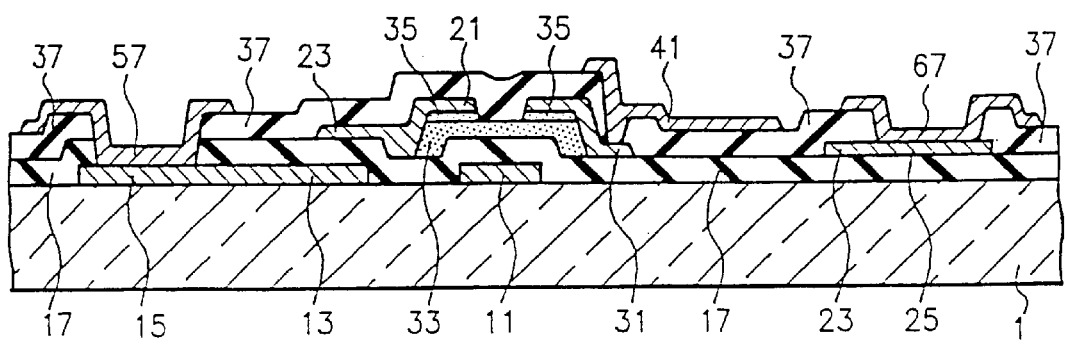
Figure 3A:
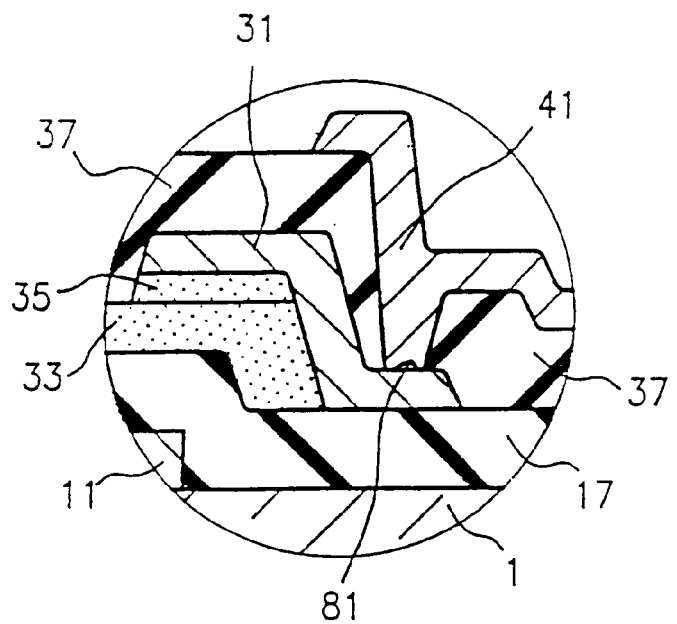
FIG. 3a is a cross-sectional view showing the contact between the drain electrode and the pixel electrode in the conventional liquid crystal display.
Figure 3B:
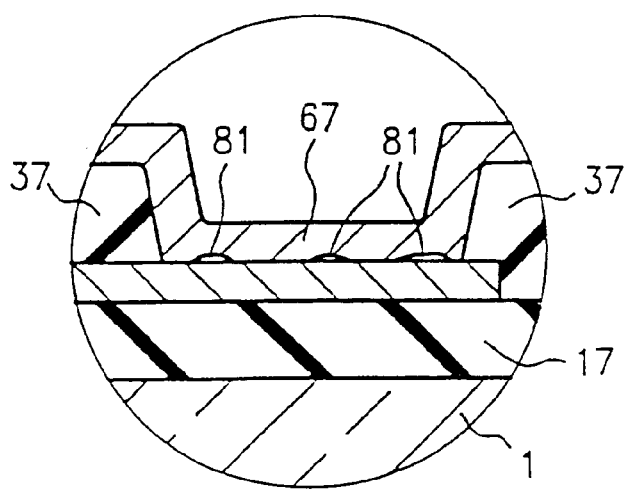
FIG. 3b is a cross-sectional view showing the contact between the source pad and the source pad terminal in the conventional liquid crystal display.
Figure 4:
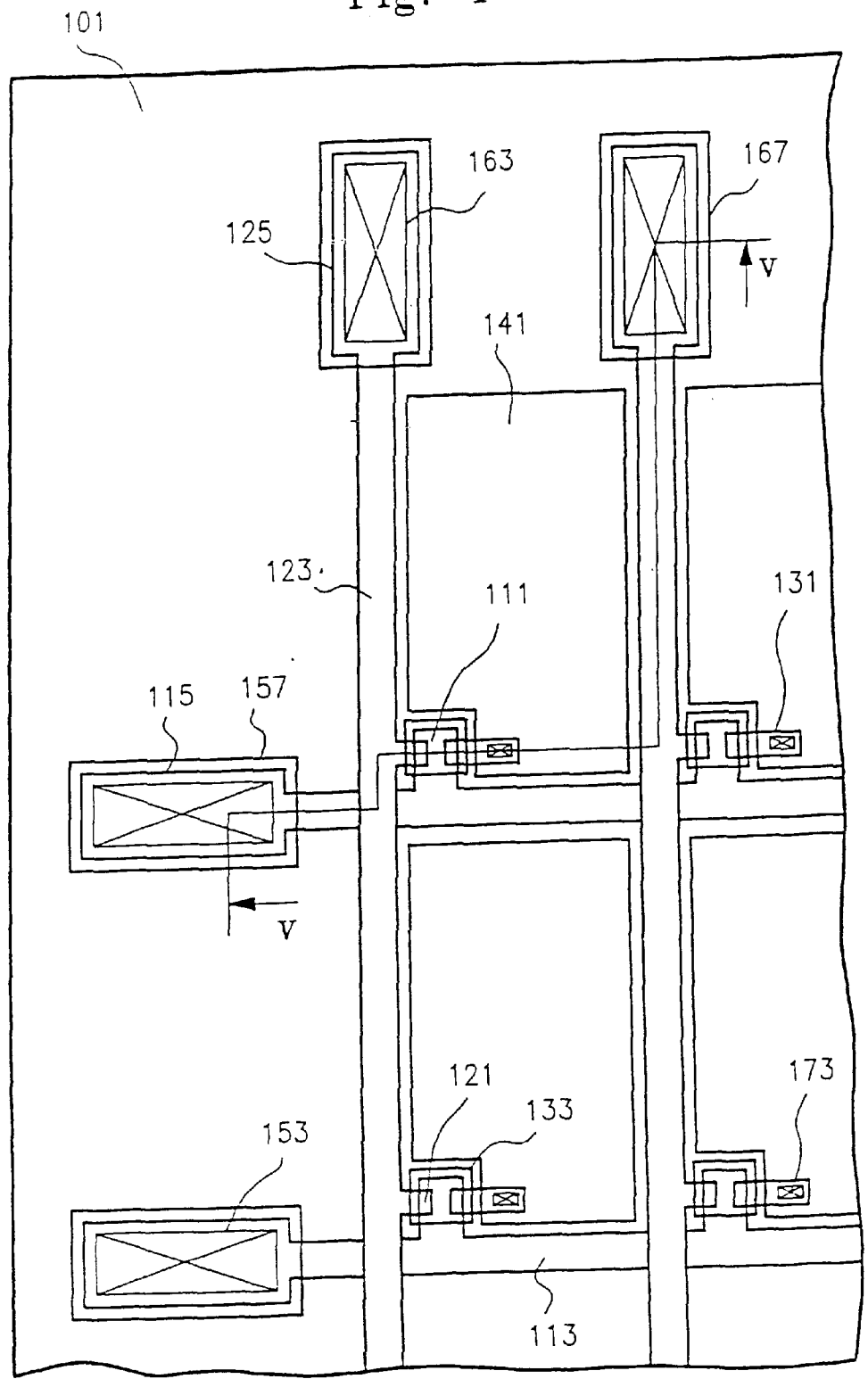
FIG. 4 is an enlarged view showing a liquid crystal display of the present invention.

A preferred embodiment is described with reference to FIG. 4, which is an enlarged view showing an active panel of a liquid crystal display, and to FIG. 5, which is a cross-sectional view, taken along line V—V of FIG. 4, showing a manufacturing process.

Figure 5A:
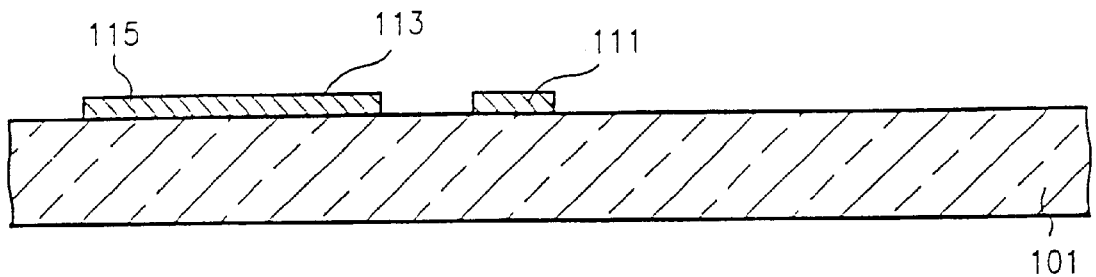
FIGS. 5a–5e are a cross-sectional views showing a manufacturing process of the liquid crystal display according to the present invention.

A metal including aluminum is deposited on a transparent glass substrate 101 to form a first metal layer. A gate electrode 111, a gate bus line 113, and a gate pad 115 are formed by patterning the first metal layer. The gate electrode 111 is disposed at the corner of each pixel arrayed in matrix. The gate line 113 connects the gate electrodes 111 arrayed in a row direction. The gate pad 115 is formed at the end of the gate line 113 (FIG. 5a).

Figure 5B:
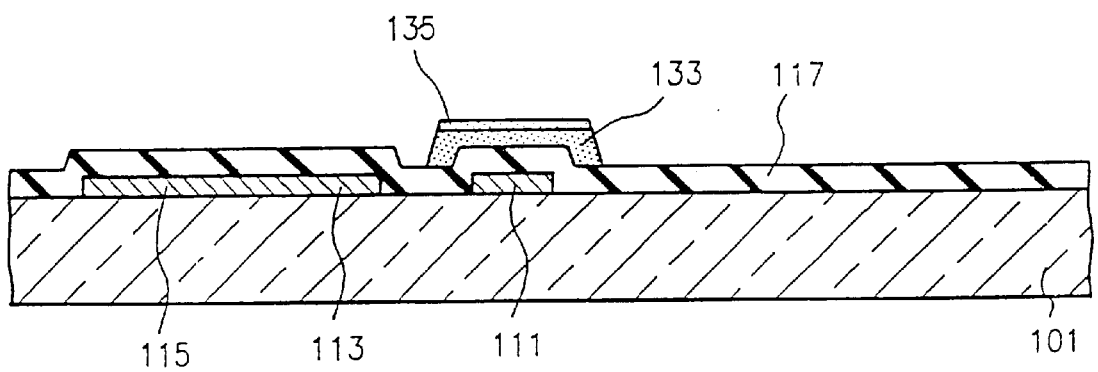

An inorganic insulating material such as silicon oxide ($SiO_x$) or silicon nitride ($SiN_x$) is deposited on the gate electrode 111, the gate line 113, and the gate pad 115 to form a gate insulating layer 117. Then, an intrinsic semiconductor material such as an intrinsic amorphous silicon and, a doped semiconductor material such as a doped amorphous silicon are sequentially deposited on the entire surface of the substrate. These materials are patterned to form a semiconductor layer 133 and a doped semiconductor layer 135 at the portion at which the gate electrode 111 is formed(FIG. 5b).

Figure 5C:
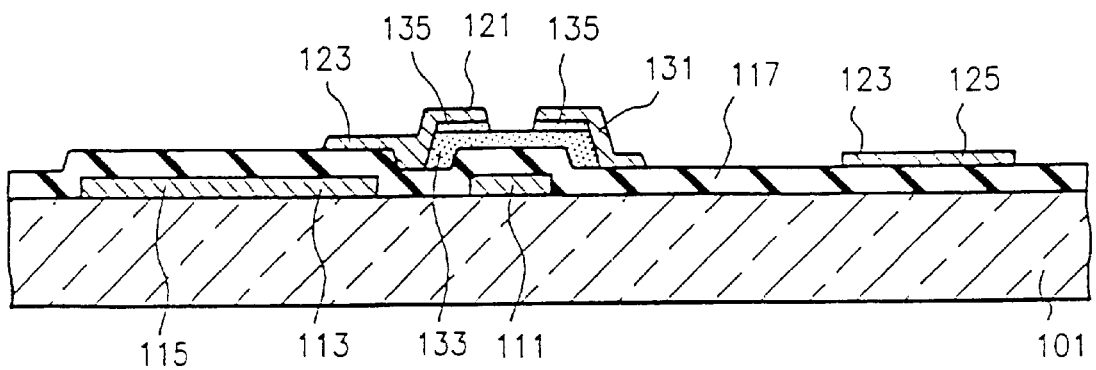

A metal including molybdenum, tantalum, molybdenum alloy or tantalum alloy is deposited and patterned to form a source electrode 121 which contacts one side of the semiconductor layer 133 with the doped semiconductor layer 135 between them. The drain electrode 131 contacts the other side of the semiconductor layer 133 with the doped semiconductor layer 135 between them. The source electrode 121 and drain electrode 131 from ohmic contacts with the doped semiconductor layer 135. The doped semiconductor layer 135 between the source electrode 121 and the drain electrode 131 must be removed by continued etching after forming the source 121 and drain electrode 131. The source electrode 121 in a row direction are connected to the source bus line 123. The source pad 125 is placed at the end portion of the source bus line 123 (FIG. 5c).

Figure 5D:
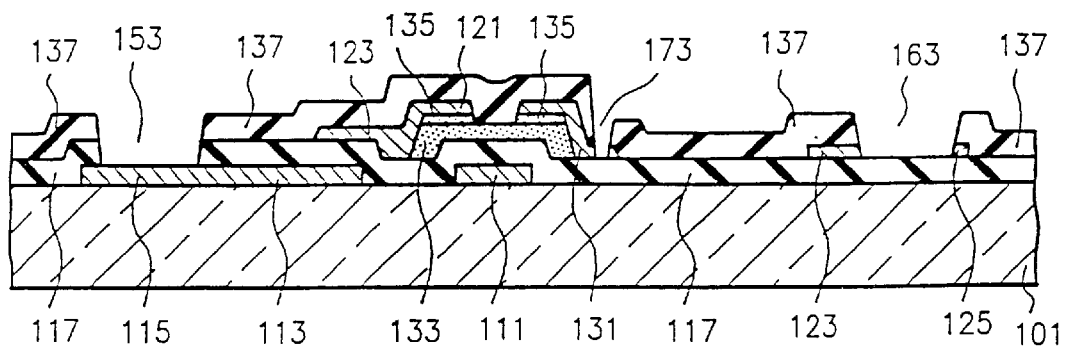

An inorganic insulating material such as silicon oxide or silicon nitride is deposited on the whole surface of the substrate 101 to form a passivation layer 137. The passivation layer 137 is patterned to form a source contact hole 163 and a drain contact hole 173 which expose some portions of the source pad 125 and the drain electrode 131, respectively. The metal surface including molybdenum or tantalum is easily etched by the etchant for the passivation layer including silicon oxide or silicon nitride. Therefore, the drain electrode 131 and the source pad 125 are etched so as to form an etched side wall. At the same time, a gate contact hole 153 exposes some surface of the gate pad 115 (FIG. 5d).

Figure 5E:
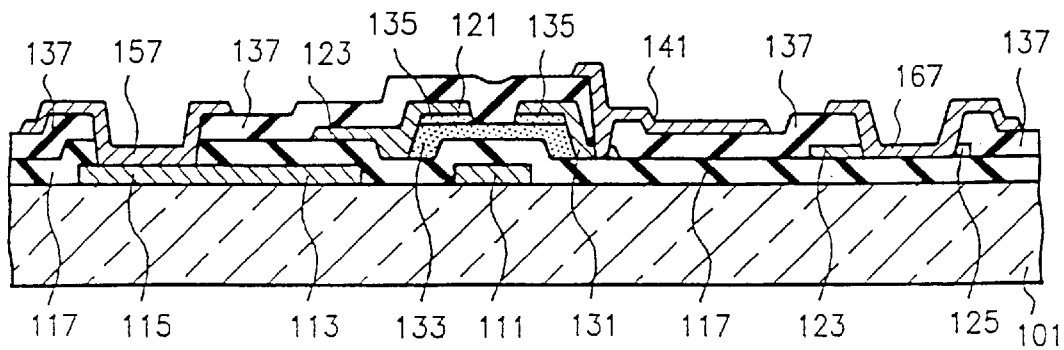

An Indium Tin Oxide(ITO) is deposited on the whole surface of the substrate 101 having the passivation layer 137. A pixel electrode 141, a gate pad connector 157 and a source pad connector 167 are formed by patterning the ITO. The pixel electrode 141 is connected to the drain electrode 131 through the drain contact hole 173. The gate pad connector 157 is connected to the gate pad 115 through the gate contact hole 153. The source pad connector 167 is connected to the source pad 125 through the source contact hole 163. The pixel electrode 141 is connected to the etched side wall of the drain electrode 131 through the drain contact hole 173. Moreover, the source pad connector 167 is connected to the etched side wall of the source pad 125 through the source contact hole 163 (FIG. 5e).

Figure 6A:
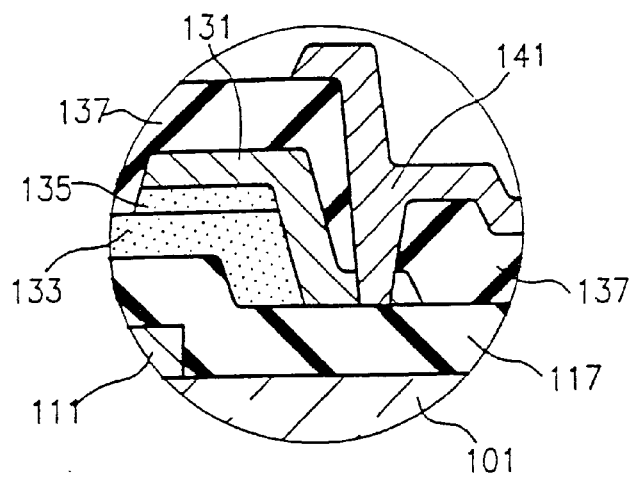
FIG. 6a is a cross-sectional view showing a contact between the drain electrode and the pixel electrode according to the present invention.
Figure 6B:
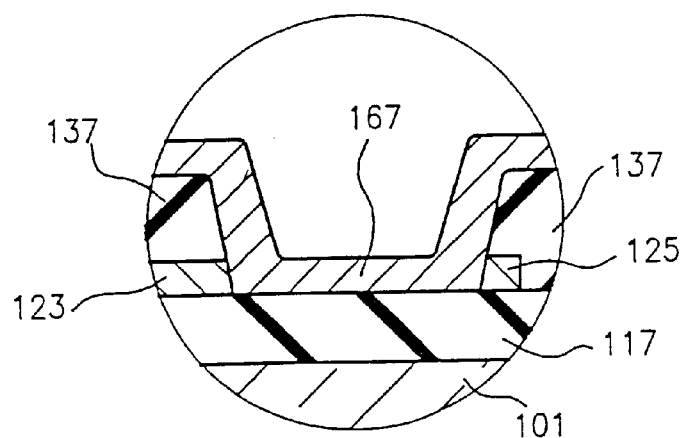
FIG. 6b is a cross-sectional view showing a contact between the source pad and the source pad terminal according to the present invention.

According to the present invention, the etched side wall of the drain electrode 131 which has no contaminating material by allowing a sufficient etching time, as shown in FIG. 6a. Therefore, the electrical contact was purely maintained so that the image signal applied to the pixel electrode was not distorted. The source pad terminal 167 also contacts the etched side wall of the source pad, so that there is no contaminating material between them (FIG. 6b).

Figure 6C:
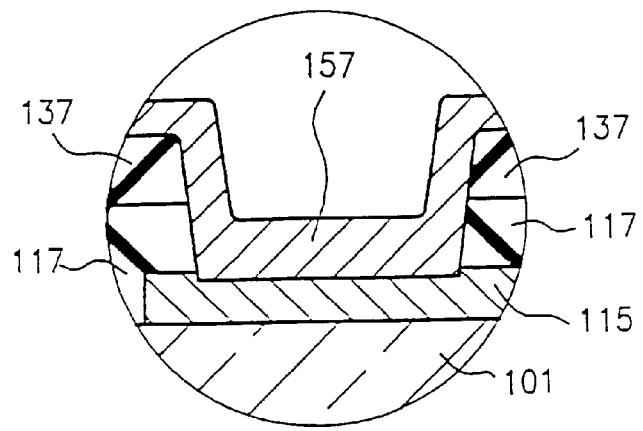
FIG. 6c is a cross-sectional view showing a contact between the gate pad and the gate pad terminal according to the present invention.

When the passivation layer 137 is patterned, at the drain contact hole 173, the passivation layer 137 and the drain electrode 131 are stacked. On the other hands, at the gate contact hole 153, the passivation layer 137, the gate pad 115, and the gate insulation layer 117 are stacked. The passivation layer 137 and the gate insulation layer 117 may have a similar etching rate for a certain etchant. However, the gate insulation layer 117 has a different etching rate from the source material. Therefore, by using an etchant having a similar etching rate for the passivation layer 137, the gate insulation layer 117, and the source material, it is possible to form the drain contact hole 173, the source contact hole 163, and the gate contact hole 153 at the same time. If the source material is etched slightly slower than the gate insulation layer 117, then some surface of the gate pad 115 is etched. Otherwise, more etching time is needed to expose the surface of the gate pad 115. In that case, some gate insulation layer 117 underneath the source pad 125 may be etched. Between the two cases, the first case is more preferable than the second one, with reference to the electrical contact between the gate pad 115 and the gate pad terminal 157, as shown in FIG. 6c.

Accordingly, the present invention relates to a method of enhancing the electrical contact between the drain electrode and the pixel electrode. According to the present invention, when the passivation layer is patterned to expose the drain electrode, the drain electrode is also patterned with the passivation layer to expose the etched side wall of the pixel electrode. Therefore, it is possible to enhance the electrical contact between the pixel electrode and the drain electrode by eliminating the residual material between them. Thus, the LCD panel of the present invention has a more enhanced quality of the image than that of the conventional LCD.

Furthermore, in the present invention, the drain electrode comprises molybdenum or tantalum which can be easily etched by an etchant of the passivation layer so that the process of etching the passivation layer and the drain electrode is performed in a single step. Therefore, the present invention can be performed without any additional processing step so that a higher production yield is obtained than the conventional method.

It will be apparent to those skilled in the art that various modification and variations can be made in a liquid crystal display and the method of manufacturing the same of the present invention without departing from the spirit or scope of the inventions. Thus, it is intended that the present invention cover the modifications and variations of this invention provided they come within the scope of the appended claims and their equivalents.

What is claimed is:

1. A method of manufacturing a liquid crystal display comprising the steps of:
    forming a gate electrode including a first metal on a substrate;
    forming a gate insulation layer on the substrate having the gate electrode;
    forming a semiconductor layer on the gate insulation layer covering the gate electrode;
    forming a source electrode contacting one side of the semiconductor layer, a drain electrode contacting the other side of the semiconductor layer using a second metal;
    forming a passivation layer on the substrate having the source electrode;
    forming a drain contact hole by patterning some portion of the passivation layer and the drain electrode, wherein the drain electrode has an etched side wall; and
    forming a pixel electrode contacting the etched side wall of the drain electrode using a transparent conductive material.

2. A method of manufacturing a liquid crystal display according to claim 1, further comprising the steps of:
    forming a gate line connected to the gate electrode;
    forming a gate pad at an end portion of the gate line;
    forming a source line connected to the source electrode;
    forming a source pad at an end portion of the source line;
    etching a portion of the source pad to form an etched side wall of the source pad; and
    forming a source pad terminal contacting the etched side wall of the source pad.

3. A method of manufacturing a liquid crystal display according to claim 1, wherein the step of patterning the passivation layer includes the step of etching the gate insulation layer to form a gate contact hole exposing the gate pad.

4. A method of manufacturing a liquid crystal display according to claim 1, wherein the first metal comprises aluminum.

5. A method of manufacturing a liquid crystal display according to claim 1, wherein the second metal comprises at least one of molybdenum and tantalum.

6. A method of manufacturing a liquid crystal display according to claim 1, wherein the conductive material comprises Indium Tin Oxide.

7. A method of manufacturing a liquid crystal display according to claim 1, further comprising the steps of:
    forming a gate line connected to the gate electrode; and
    forming a gate pad at an end portion of the gate line.

8. A method of manufacturing a liquid crystal display according to claim 1, further comprising the steps of:
    forming a source line connected to the source electrode;
    forming a source pad at an end portion of the source line; and
    etching a portion of the source pad to form an etched side wall of the source pad.

9. A method of manufacturing a liquid crystal display according to claim 8, further comprising the step of forming a source pad terminal contacting the etched side wall of the source pad.

10. A method of manufacturing a liquid crystal display according to claim 1, wherein the step of forming the drain contact hole exposes a portion of the gate insulating layer.

11. A liquid crystal display comprising:
    a substrate;
    a gate electrode including a first metal on the substrate;
    a gate insulation layer over the gate electrode;
    a semiconductor layer including an intrinsic semiconductive material on the gate insulation layer;
    a source electrode including a second metal on a first side of the semiconductor layer;
    a drain electrode including the second metal on a second side of the semiconductor layer;
    a passivation layer covering the source and drain electrodes and including a drain contact hole exposing a side wall of the drain electrode; and
    a pixel electrode including a transparent conductive material and contacting the side wall of the drain electrode through the drain contact hole.

12. A liquid crystal display according to claim 11, further comprising:
    a gate line including the first metal and connected to the gate electrode;
    a gate pad at an end portion of the gate line including the first metal;
    a source line including the second metal and connected to the source electrode;
    a source pad at an end portion of the source line including the second metal, the passivation layer having a source contact hole exposing a side wall of the source pad; and
    a source pad terminal including the conductive material and contacting the side wall of the source pad through the source contact hole.

13. A liquid crystal display according to claim 11, further comprising a gate line including the first metal and connected to the gate electrode.

14. A liquid crystal display according to claim 13, further comprising a gate pad at an end portion of the gate line including the first metal.

15. A liquid crystal display according to claim 11, further comprising a source line including the second metal and connected to the source electrode.

16. A liquid crystal display according to claim 15, further comprising a source pad at an end portion of the source line including the second metal, the passivation layer having a source contact hole exposing a side wall of the source pad.

17. A liquid crystal display according to claim 16, further comprising a source pad terminal including the conductive material and contacting the side wall of the source pad through the source contact hole.

18. A liquid crystal display according to claim 11, wherein the passivation layer includes a gate contact hole exposing the gate pad.

19. A liquid crystal display according to claim 18, further comprising a gate pad terminal including the conductive material and contacting the gate pad through the gate contact hole.

20. A liquid crystal display according to claim 11, wherein the first metal comprises aluminum.

21. A liquid crystal display according to claim 11, wherein the second metal comprises at least one of molybdenum and tantalum.

22. A liquid crystal display according to claim 11, wherein the conductive material comprises an Indium Tin Oxide.

23. A liquid crystal display according to claim 11, wherein a portion of the gate insulating layer is exposed through the drain contact hole.

24. A liquid crystal display according to claim 11, wherein the second metal is easily etched by an etchant for the passivation layer.

25. A method of manufacturing a liquid crystal display comprising the steps of:

forming a gate electrode including a first metal on a substrate;

forming a gate line connected to the gate electrode;

forming a gate pad at an end portion of the gate line;

forming a gate insulation layer on the substrate having the gate electrode;

forming a semiconductor layer on the gate insulation layer covering the gate electrode;

forming a source electrode contacting one side of the semiconductor layer, a drain electrode contacting the other side of the semiconductor layer using, a second metal;

forming a passivation layer on the substrate having the source electrode, including the step of etching the gate insulation layer to form a gate contact hole exposing the gate pad;

forming a drain contact hole by patterning a first portion of the passivation layer and the drain electrode, wherein the drain electrode has an etched side wall; and forming a pixel electrode contacting the etched side wall of the drain electrode using a transparent conductive material.

26. A liquid crystal display comprising:

a substrate;

a gate electrode including a first metal on the substrate;

a gate line including the first metal and connected to the gate electrode;

a gate pad at an end portion of the gate line including the first metal;

a gate insulation layer over the gate electrode;

a semiconductor layer including an intrinsic semiconductive material on the gate insulation layer;

a source electrode including a second metal on a first side of the semiconductor layer;

a drain electrode including the second metal on a second side of the semiconductor layer;

a passivation layer covering the source and drain electrodes including a drain contact hole exposing a side wall of the drain electrode and further including a gate contact hole exposing the gate pad; and a pixel electrode including a transparent conductive material and a contacting the side wall of the drain electrode through the drain contact hole.

27. A liquid crystal display according to claim 26, wherein the second metal layer is easily etched by an etchant for the passivation layer.

28. A liquid crystal display comprising:

a substrate;

a gate electrode including a first metal on the substrate;

a gate insulation layer over the gate electrode;

a semiconductor layer including an intrinsic semiconductive material on the gate insulation layer;

a source electrode including a second metal on a first side of the semiconductor layer;

a drain electrode including the second metal on a second side of the semiconductor layer;

a passivation layer covering the source and the drain electrodes and including a drain contact hole exposing an etched side wall of the drain electrode; and a pixel electrode including a conductive material and contacting the etched side wall of the drain electrode through the etched drain contact hole.

29. A liquid crystal display according to claim 28, wherein the second metal is easily etched by an etchant for the passivation layer.

* * * * *